United States Patent
Yin et al.

(10) Patent No.: US 7,105,431 B2
(45) Date of Patent: Sep. 12, 2006

(54) MASKING METHODS

(75) Inventors: Zhiping Yin, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 127 days.

(21) Appl. No.: 10/652,174

(22) Filed: Aug. 22, 2003

(65) Prior Publication Data

US 2005/0042879 A1 Feb. 24, 2005

(51) Int. Cl.
*H01L 21/3205* (2006.01)
*H01L 21/4763* (2006.01)

(52) U.S. Cl. .................. 438/595; 438/783; 438/945; 438/952

(58) Field of Classification Search .............. 438/595, 438/783, 945, 952
See application file for complete search history.

(56) References Cited

U.S. PATENT DOCUMENTS

| | | | |
|---|---|---|---|
| 4,382,100 A | 5/1983 | Holland | 427/38 |
| 4,436,797 A | 3/1984 | Brady et al. | 430/5 |
| 4,510,176 A | 4/1985 | Cuthbert et al. | 427/82 |
| 4,675,265 A | 6/1987 | Kazama et al. | |
| 4,732,785 A | 3/1988 | Brewer | 427/240 |
| 4,886,728 A | 12/1989 | Salamy et al. | 430/331 |
| 4,994,404 A | 2/1991 | Sheng et al. | 437/44 |
| 5,433,794 A | 7/1995 | Fazan et al. | |
| 5,656,128 A * | 8/1997 | Hashimoto et al. | 216/47 |
| 5,754,390 A | 5/1998 | Sandhu et al. | |
| 5,814,433 A | 9/1998 | Nelson et al. | 430/326 |
| 5,952,050 A | 9/1999 | Doan | 427/336 |
| 6,188,097 B1 | 2/2001 | Derderian et al. | |
| 6,211,033 B1 | 4/2001 | Sandhu et al. | |
| 6,218,237 B1 | 4/2001 | Sandhu et al. | |
| 6,238,994 B1 | 5/2001 | Derderian et al. | |
| 6,297,112 B1 | 10/2001 | Lin et al. | |
| 6,306,702 B1 | 10/2001 | Hao et al. | |
| 6,333,255 B1 | 12/2001 | Sekiguchi | |
| 6,342,423 B1 | 1/2002 | Ishida et al. | |
| 6,344,396 B1 | 2/2002 | Ishida et al. | |

(Continued)

FOREIGN PATENT DOCUMENTS

JP 11-214290 6/1999

OTHER PUBLICATIONS

U.S. patent application Ser. No. 10/463,185, Yin et al., filed Jun. 17, 2003.
U.S. Appl. No. 10/661,379, Zhiping et al., filing date Sep. 12, 2003.
U.S. Appl. No. 10/661,100, Sandhu et al., filing date Sep. 12, 2003.
PCT International Search Report for US04/026517, 4 pages (Jan. 12, 2005).
PCT Written Opinion for US04/026517, 6 pages (Jan. 12, 2005).

*Primary Examiner*—Michelle Estrada
(74) *Attorney, Agent, or Firm*—Wells St. John P.S.

(57) ABSTRACT

The invention includes masking methods. In one implementation, a masking material comprising boron doped amorphous carbon is formed over a feature formed on a semiconductor substrate. The masking material comprises at least about 0.5 atomic percent boron. The masking material is substantially anisotropically etched effective to form an anisotropically etched sidewall spacer comprising the boron doped amorphous carbon on a sidewall of the feature. The substrate is then processed proximate the spacer while using the boron doped amorphous carbon comprising spacer as a mask. After processing the substrate proximate the spacer, the boron doped amorphous carbon comprising spacer is etched from the substrate. Other implementations and aspects are contemplated.

44 Claims, 8 Drawing Sheets

U.S. PATENT DOCUMENTS

| | | |
|---|---|---|
| 6,368,986 B1 | 4/2002 | Budge et al. |
| 6,369,431 B1 | 4/2002 | Gonzalez et al. |
| 6,376,284 B1 | 4/2002 | Gonzalez et al. |
| 6,395,602 B1 | 5/2002 | Sandhu et al. |
| 6,399,982 B1 | 6/2002 | Derderian et al. |
| 6,453,916 B1 | 9/2002 | Tran et al. ............... 134/58 |
| 6,472,283 B1 | 10/2002 | Ishida et al. |
| 6,475,868 B1 | 11/2002 | Hao et al. |
| 6,495,312 B1 | 12/2002 | Young et al. ............ 430/328 |
| 6,500,756 B1 | 12/2002 | Bell et al. ............... 438/639 |
| 6,524,775 B1 | 2/2003 | Oberlander et al. ...... 430/327 |
| 6,555,432 B1 | 4/2003 | Sandhu et al. |
| 6,559,017 B1 | 5/2003 | Brown et al. ............ 438/302 |
| 6,605,514 B1 * | 8/2003 | Tabery et al. ........... 438/303 |
| 6,608,343 B1 | 8/2003 | Derderian et al. |
| 6,617,230 B1 | 9/2003 | Budge et al. |
| 6,653,220 B1 | 11/2003 | Ma et al. |
| 6,653,733 B1 | 11/2003 | Gonzalez et al. |
| 6,670,713 B1 | 12/2003 | Gonzalez et al. |
| 6,700,211 B1 | 3/2004 | Gonzalez et al. |
| 6,750,127 B1 * | 6/2004 | Chang et al. ............ 438/585 |
| 6,875,664 B1 * | 4/2005 | Huang et al. ............ 438/299 |
| 2001/0023123 A1 | 9/2001 | Kim ........................ 438/587 |
| 2002/0073309 A1 | 6/2002 | Kurn et al. .............. 438/689 |
| 2002/0088707 A1 | 7/2002 | Towle |
| 2002/0132451 A1 | 9/2002 | Akino et al. |
| 2002/0185667 A1 | 12/2002 | Koh et al. ............... 257/347 |
| 2003/0001187 A1 | 1/2003 | Basceri et al. |
| 2003/0011011 A1 | 1/2003 | Basceri et al. |
| 2003/0045121 A1 | 3/2003 | Higashi |
| 2004/0032031 A1 | 2/2004 | Holscher et al. |
| 2004/0043574 A1 * | 3/2004 | Steiner et al. ........... 438/303 |
| 2005/0098105 A1 | 5/2005 | Fuss et al. |
| 2005/0255702 A1 | 11/2005 | Honeycutt et al. |

\* cited by examiner

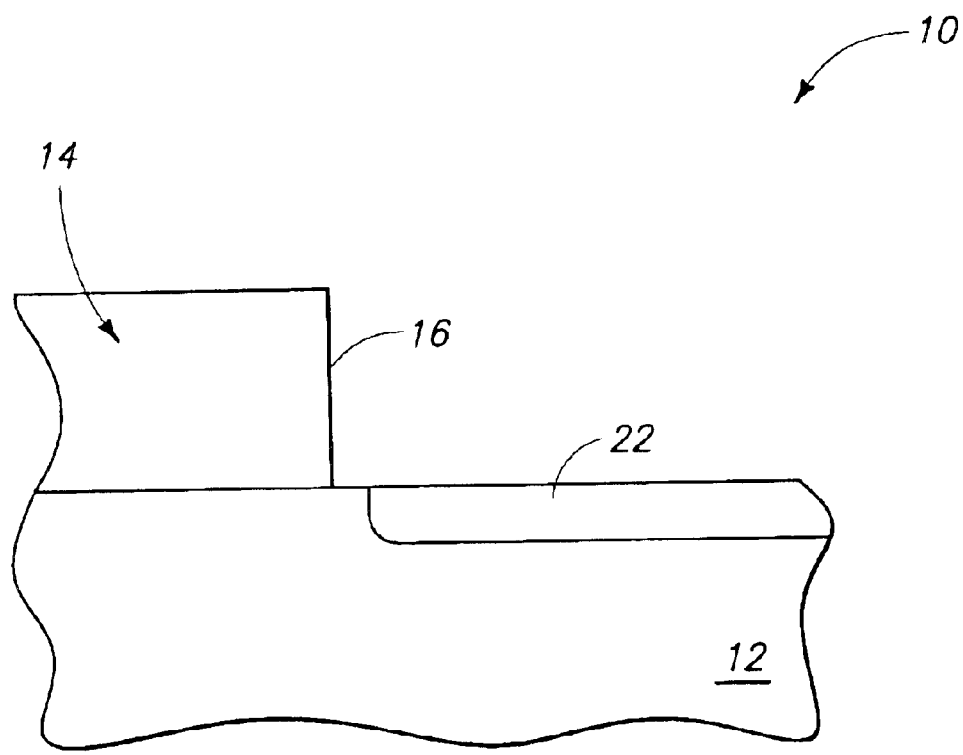
_FIG. 7_
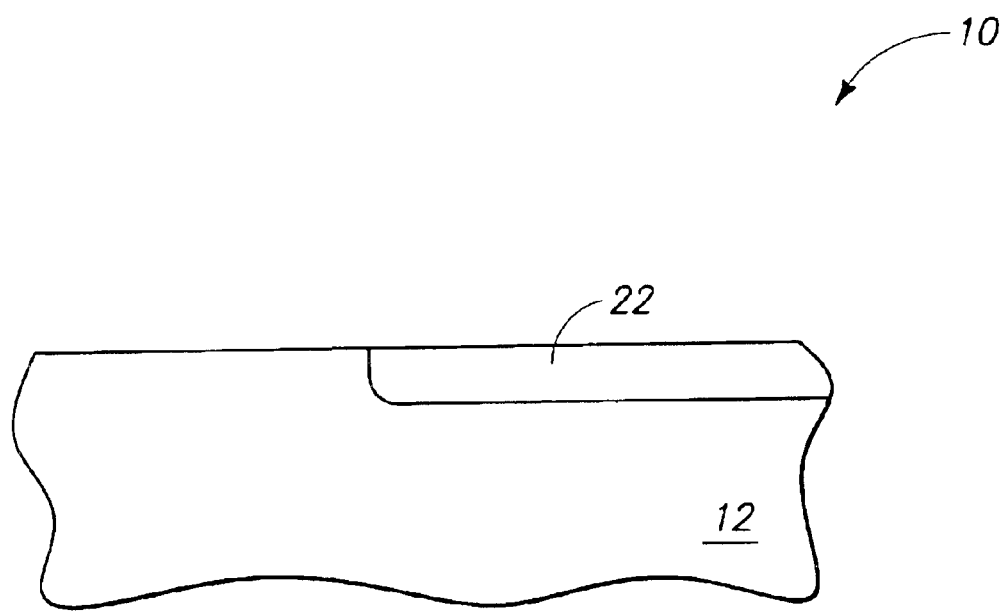
_FIG. 8_

MASKING METHODS

TECHNICAL FIELD

This invention relates to methods of masking semiconductor substrates in the fabrication of integrated circuitry.

BACKGROUND OF THE INVENTION

Integrated circuits are typically formed on a semiconductor substrate such as a silicon wafer or other semiconducting material. In general, layers of various materials which are either semiconducting, conducting or insulating are utilized to form the integrated circuits. By way of example, the various materials are doped, ion implanted, deposited, etched, grown, etc. using various processes. A continuing goal in semiconductor processing is to continue to strive to reduce the size of individual electronic components thereby enabling smaller and denser integrated circuitry.

One technique for patterning and processing semiconductor substrates is photolithography. Such typically includes deposition of a photoresist layer which can then be processed to modify the solubility of such layer in certain solvents. For example, portions of the photoresist layer can be exposed to actinic energy through a mask/reticle to change the solvent solubility of the exposed regions versus the unexposed regions compared to the solubility in the as-deposited state. Thereafter, the exposed or unexposed portions can be removed, depending on the type of photoresist, thereby leaving a masking pattern of the photoresist on the substrate. Adjacent areas of the substrate next to the masked portions can be processed, for example by etching or ion implanting, to effect the desired processing of the substrate adjacent the masking material.

In certain instances, multiple different layers of photoresist are utilized in a given masking/photolithographic step. Further, the photolithographic masking and patterning might be combined with one or more other layers. One such process forms what is commonly referred to as a "hard mask" over the substrate prior to deposition of the photoresist layer or layers. The resist layer is then patterned, for example as described above, to form masking blocks over the hard mask. The hard mask is then etched using the photoresist as a mask to transfer the pattern of the photoresist to the hard mask. The resist may or may not be removed immediately thereafter. Hard masks such as just described provide a more robust masking pattern than using resist alone, for example should the resist be completely eroded/etched away during an etch.

One material utilized as a hard mask is amorphous carbon. When etching oxide material using amorphous carbon as a hard mask, the etching typically removes the oxide at a rate of about ten times faster than it removes amorphous carbon.

Other masking methods exist in addition to photolithographic processing such as described above. For example, field effect transistors utilize a conductive gate which is typically received over a channel region of semiconductive material. Conductively doped source/drain semiconductive material regions are typically received on opposing sides of the channel region, with the gate overlying or underlying such channel region therebetween. In certain instances, it is desirable that the doping profile across the source/drain region be lighter/lower more proximate the channel region than distal therefrom. One method of processing for providing such dopant profile is to first form a desired conductive gate outline over the desired channel region of a semiconductor substrate. A suitable implant dose of a conductivity enhancing impurity can then be provided into the semiconductive material of the substrate, with the gate construction precluding such implant into the channel region. Then, an insulating layer can be conformally deposited over the gate construction and anisotropically etched to form insulative sidewall spacers over the gate. These sidewall spacers effectively function as a mask which both protects the sidewalls of the gate and precludes a subsequent implant from occurring beneath the spacers just formed. Accordingly, the sidewall spacers can be used as a mask for a subsequent higher dose source/drain implant to complete the formation of the outline of the desired source/drain regions.

While the invention was motivated in addressing the above issues, it is in no way so limited. The invention is only limited by the accompanying claims as literally worded (without interpretative or other limiting reference to the above background art description, remaining portions of the specification or the drawings) and in accordance with the doctrine of equivalents.

SUMMARY

The invention includes masking methods. In one implementation, a masking material comprising boron doped amorphous carbon is formed over a feature formed on a semiconductor substrate. The masking material comprises at least about 0.5 atomic percent boron. The masking material is substantially anisotropically etched effective to form an anisotropically etched sidewall spacer comprising the boron doped amorphous carbon on a sidewall of the feature. The substrate is then processed proximate the spacer while using the boron doped amorphous carbon comprising spacer as a mask. After processing the substrate proximate the spacer, the boron doped amorphous carbon comprising spacer is etched from the substrate.

Other aspects and implementations are contemplated.

BRIEF DESCRIPTION OF THE DRAWINGS

Preferred embodiments of the invention are described below with reference to the following accompanying drawings.

FIG. 7 is a view of the FIG. 3 wafer fragment at a processing step subsequent to that depicted by FIG. 3.

FIG. 8 is a view of the FIG. 7 wafer fragment at a processing step subsequent to that depicted by FIG. 7.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
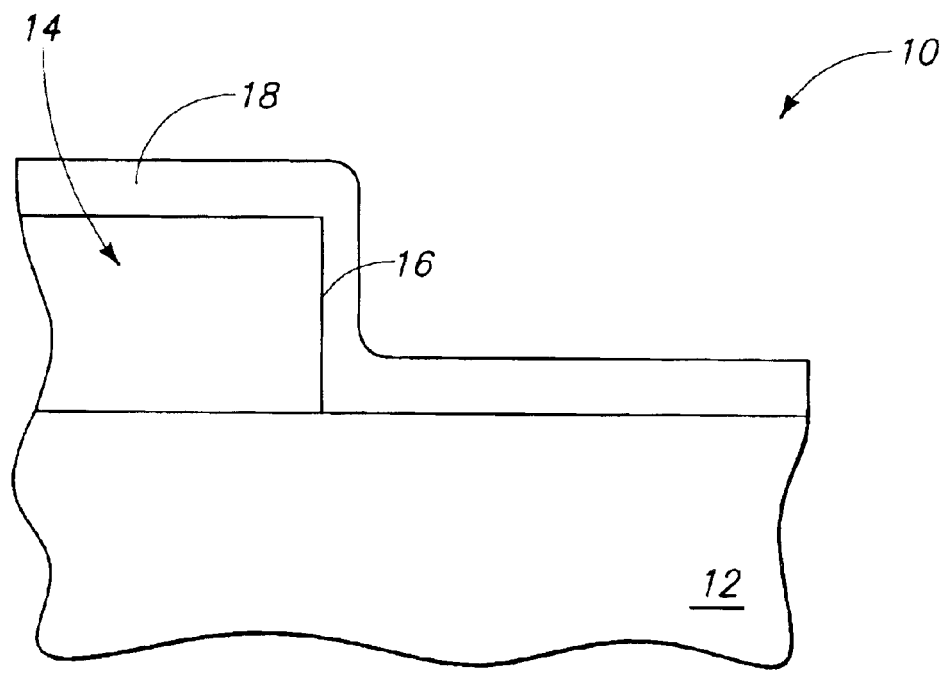
FIG. 1 is a diagrammatic sectional view of a semiconductor wafer fragment at a processing step in accordance with an aspect of the invention.

Exemplary masking methods in accordance with the invention are initially described with reference to FIGS. 1–8. Referring initially to FIG. 1, a semiconductor substrate fragment is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of this document, the term "layer" encompasses both the singular and the plural unless otherwise indicated.

In the depicted example, substrate 10 comprises a bulk monocrystalline silicon substrate 12. Some feature 14 is formed thereover. Any identifiable structural feature, whether existing or yet-to-be developed, is contemplated. By way of example only, examples include patterned photoresist layers, a partial or complete field effect transistor gate or other circuit construction, an etched region within a substrate, etc. By way of example only, feature 14 in FIG. 1 is depicted as some form of patterned material formed over substrate 12. Such has a sidewall 16 which in the illustrated embodiment is substantially perpendicular in orientation relative to substrate 12. A masking material 18 comprising, consisting essentially of, or consisting of boron doped amorphous carbon is formed over feature 14. Such masking material comprises at least about 0.5 atomic percent boron. An exemplary preferred embodiment includes a boron concentration from about 1.0 atomic percent to about 16 atomic percent. Alternate examples, by way of example only, include from 1.0 atomic percent to 5.0 atomic percent boron; from greater than 5.0 atomic percent to 10.0 atomic percent boron; from greater than 10.0 atomic percent to 15.0 atomic percent boron; from greater than 15.0 atomic percent to 20.0 atomic percent boron; and from greater than 20.0 atomic percent to 75.0 atomic percent boron.

In one exemplary embodiment, the feature might comprise amorphous carbon which is not doped with boron. In the context of this document "not doped with boron" would mean not having any detectable level of boron. If at least the outermost portions of feature 14 were amorphous carbon not doped with boron, masking material 18 would be formed thereon (meaning in contact with) such amorphous carbon material.

One preferred example of forming boron doped amorphous carbon material 18 is by chemical vapor deposition (CVD), and which may or may not be plasma enhanced. Further, the boron doping might occur during or after the chemical vapor deposition. In one exemplary preferred embodiment, the chemical vapor depositing uses at least one of $C_2H_6$, $C_2H_4$, $C_2H_2$, $C_3H_6$ and $C_3H_8$. Further in one preferred embodiment, the chemical vapor depositing uses at least one of $B_2H_6$, $B_4H_{10}$ and $BH_3CO$, and thereby would form the amorphous carbon to be in situ boron doped as-deposited.

By way of example only, exemplary chemical vapor deposition tools include the Applied Materials Centura Processor and the Producer Processor available from Applied Materials of Santa Clara, Calif. Further and by way of example only, the following provides exemplary preferred methods of chemical vapor depositing material 18 utilizing such processors. One exemplary process gas is $C_3H_6$ at an exemplary flow rate of from 300 sccm to 900 sccm, with 600 sccm being a specific example. $B_2H_6$ is an exemplary boron source gas which can be flowed with the $C_3H_6$, and at an exemplary flow rate of from 100 sccm to 2000 sccm depending on the flow rate of the other gases and depending on the desired boron concentration in the boron doped amorphous carbon layer being formed. Additional exemplary carrier or other reactive or non-reactive gases might also be utilized, for example, He and/or $H_2$ at from 0 sccm to 500 sccm. An exemplary preferred substrate temperature is from 400° C. to 650° C., with an exemplary preferred pressure range being from 3 Torr to 7 Torr. An exemplary preferred spacing from the wafer surface to a gas-emitting showerhead is from 190 mils to 240 mils. An exemplary preferred applied power range in a capacitively coupled, single electrode plasma deposition tool (such as those above) is from 100 watts to 800 watts for a 200 mm wafer. Further by way of example only, exemplary non-plasma enhanced CVD parameters include a temperature of from about 500° C. to 800° C., pressure at from 50 mTorr to 200 mTorr, $C_3H_6$ flow at from 50 sccm to 1000 sccm, $B_2H_6$ flow at from 100 sccm to 2000 sccm, and with or without any He and/or $H_2$.

The quantity of boron doping during the deposition has been determined to impact the degree of conformality of the deposition of material 18 over the steps of features. Generally speaking, the higher the boron concentration, the better the step coverage. For example within the above parameter ranges, a $B_2H_6$ to $C_3H_6$ volumetric flow rate ratio of 0.4 gave about 26% coverage over vertical steps as compared to horizontal surfaces, while a flow rate ratio of $B_2H_6$ to $C_3H_6$ of 2.1 provided 64% coverage over vertical steps as compared to horizontal surfaces. The 0.4 ratio provided an atomic boron concentration in the material 18 of about 3.0% boron, while the 2.1 flow ratio provided about 16% boron. RF power on the electrodes was determined to not be particularly impacting relative to conformality. In one exemplary reduction to practice example, step coverage of about 74% over vertical as compared to horizontal surfaces was achieved with a showerhead/wafer surface spacing of 215 mils, power at 250 watts, and precursor flow rates at 1250 sccm $B_2H_6$, $C_3H_6$ at 650 sccm, substrate temperature of 550° C. and chamber pressure of 5 Torr. High degree of conformality may or may not be desired depending on the application.

Figure 2:
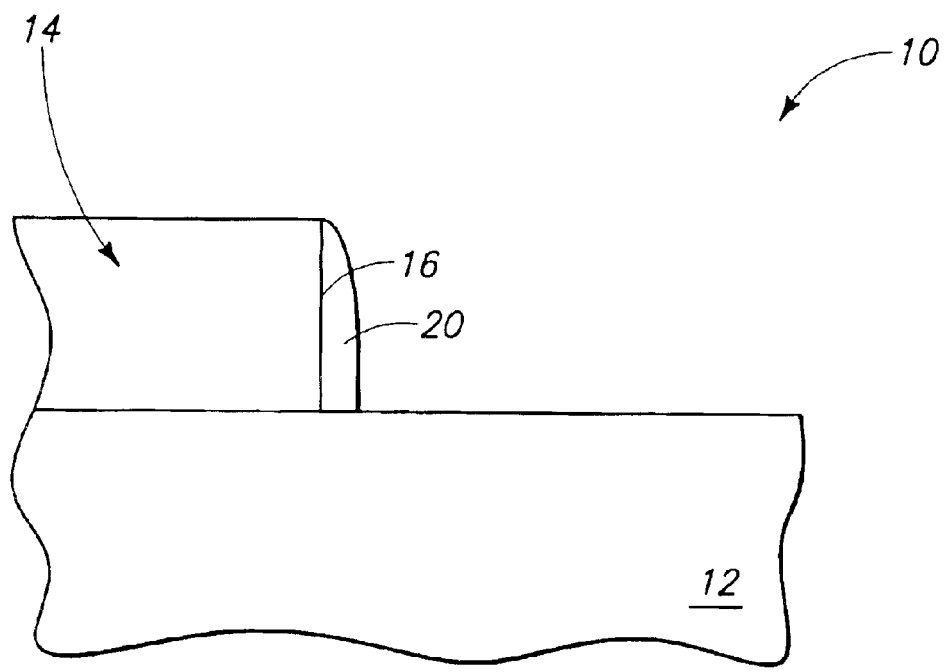
FIG. 2 is a view of the FIG. 1 wafer fragment at a processing step subsequent to that depicted by FIG. 1.

Referring to FIG. 2, masking material 18 has been substantially anisotropically etched effective to form an anisotropically etched sidewall spacer 20 comprising the boron doped amorphous carbon on sidewall 16 of feature 14. By way of example only, an exemplary process for anisotropically etching such material includes using a combination of $CF_4$ and/or other fluoride containing gases at from 5 sccm to 20 sccm, $SO_2$ at from 20 sccm to 60 sccm and $O_2$ at from 50 sccm to 120 sccm. An exemplary substrate temperature is from 5° C. to 75° C., chamber pressure at from 5 mTorr to 15 mTorr, and source plasma power at from 150 to 250 Watts and bias power at from 30 to 100 Watts per 200 mm of wafer diameter.

Figure 3:
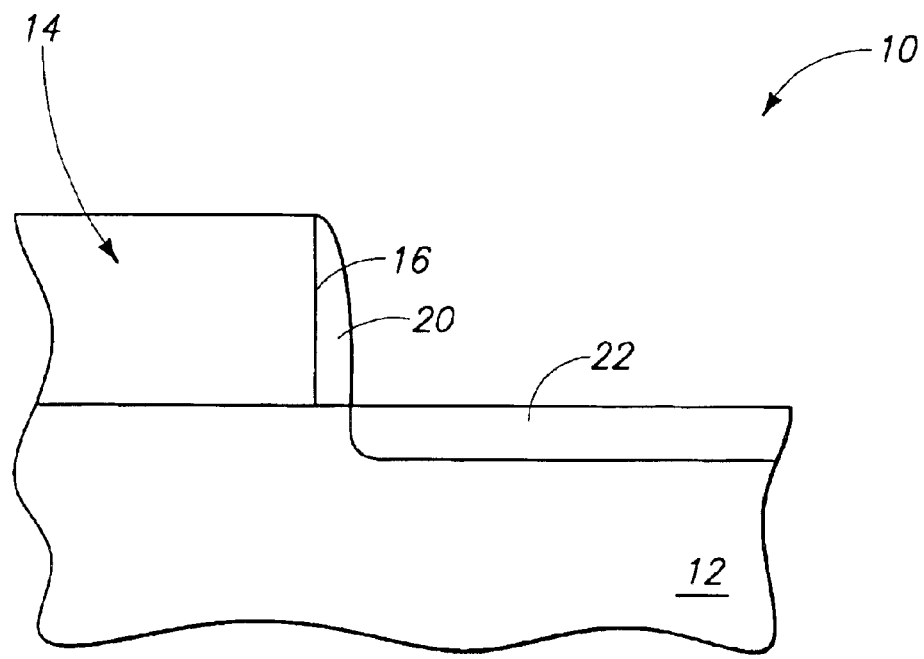
FIG. 3 is a view of the FIG. 2 wafer fragment at a processing step subsequent to that depicted by FIG. 2.
Figure 4:
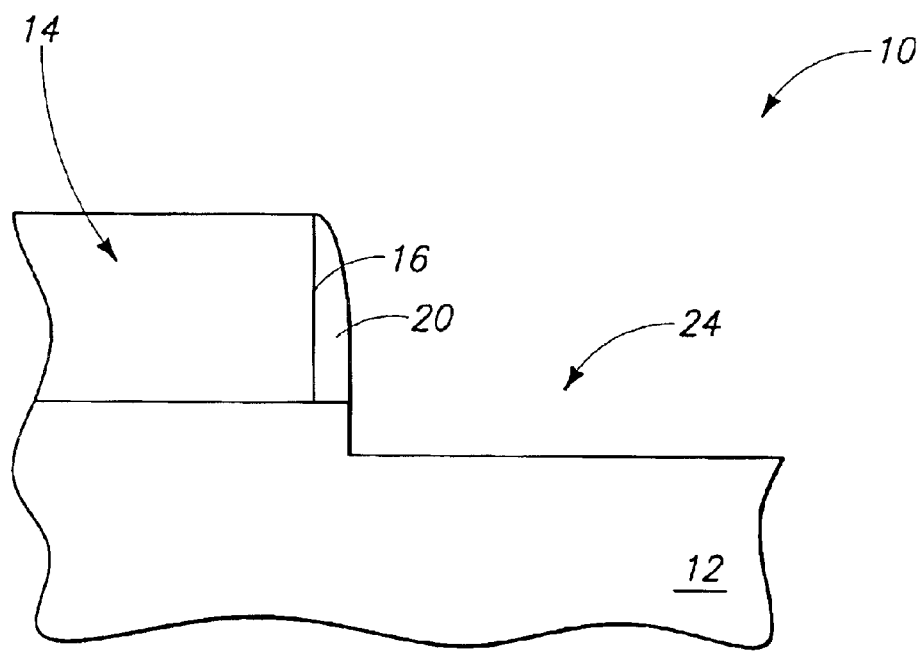
FIG. 4 is an alternate/addition to that depicted by FIG. 3.
Figure 5:
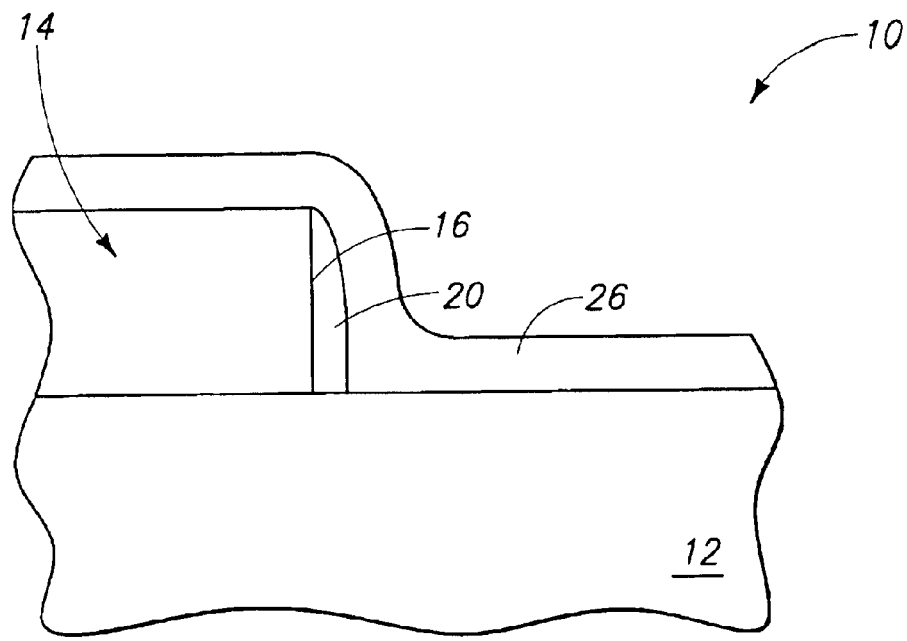
FIG. 5 is another alternate/addition to that depicted by FIG. 3.
Figure 6:
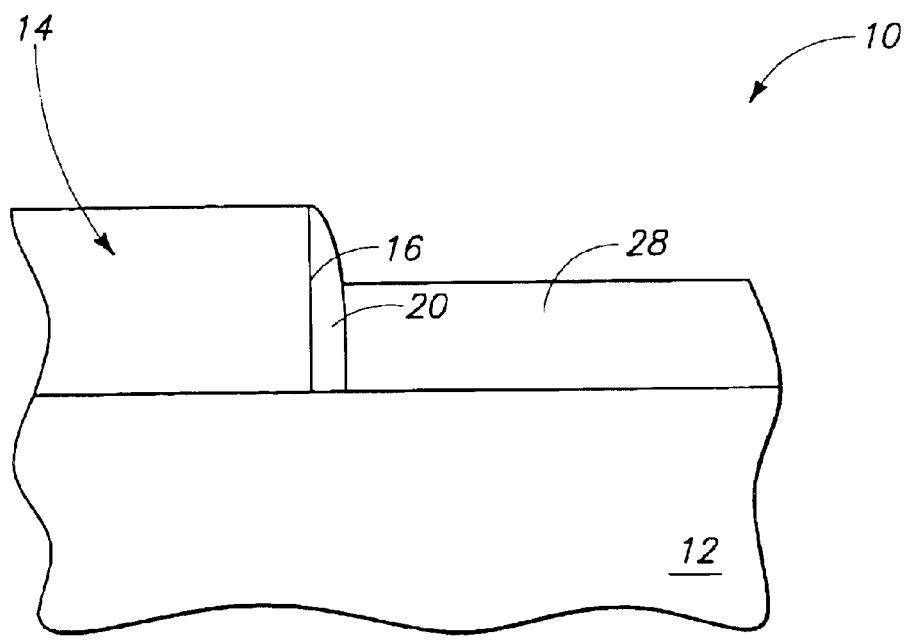
FIG. 6 is still another alternate/addition to that depicted by FIG. 3.

The boron doped amorphous carbon comprising spacer is next utilized as a mask while processing the substrate proximate said spacer. By way of example only, such processing of the substrate using the boron doped amorphous carbon comprising spacer as a mask could include any one or combination of ion implanting into the substrate, etching the substrate and depositing upon the substrate. For example, FIG. 3 depicts exemplary processing in the form of ion implantation to form a diffusion region 22. FIG. 4 depicts exemplary processing in the form of etching to form a recess or trench portion 24 relative to the substrate. FIG. 5 depicts by way of example a deposition process whereby a layer 26 is deposited over substrate 12, with boron doped amorphous carbon comprising spacer 20 serving as a mask to deposition of layer 26 immediately over substrate material 12 covered by spacer 20. FIG. 6 by way of example only depicts some form of selective deposition/processing to form a layer 28 over/from substrate material 12, with boron doped amorphous carbon comprising spacer 20 masking substrate material 12 therebeneath from such processing. By way of example only, such might constitute epitaxial silicon growth and/or thermal processing and/or other selective deposition/formation method whether existing or yet-to-be-developed.

After such processing of the substrate, the boron doped amorphous carbon comprising spacer is etched from the substrate. FIG. 7 depicts exemplary such processing subsequent to the processing depicted by FIG. 3. One most preferred process for etching the boron doped amorphous carbon comprising spacer uses an $O_2$ comprising plasma. By way of example only, an exemplary preferred process utilizes an $O_2$ ashing plasma chamber having a substrate temperature of from 300° C. to 650° C., a substrate to showerhead spacing of from 400 mils to 800 mils, a pressure of from 4 Torr to 9 Torr, an $O_2$ gas flow of from 1000 sccm to 2500 sccm, and a plasma power range of from 200 watts to 1000 watts. Processing under such conditions can result in an essentially isotropic etch of a 1500 Angstrom thick film of a boron doped amorphous carbon comprising spacer constituting 0.5% to 1.0% boron in about 75 seconds.

In conjunction with the above-described processing, it has been discovered that boron doping concentration provides a trade-off between step coverage and ease of isotropic $O_2$-only plasma etching. While higher boron concentration results in better step coverage, the higher the boron concentration, the more difficult it may be to $O_2$-only plasma etch such material from the substrate. As boron doping exceeds 10 atomic percent, $O_2$-only plasma etching under the above-described conditions might be considered as becoming unacceptably low/slow. By way of example only, an etching gas comprising $CF_4$ will etch an amorphous carbon comprising spacer independent of the quantity of boron doping.

The capability of using an $O_2$ comprising plasma in etching a sacrificial spacer from a substrate may provide particular advantage as such etching can be conducted under the above conditions substantially selective to any of silicon dioxide, silicon nitride, monocrystalline silicon, and polycrystalline silicon. Such substantial selectivity in comparative etch rates is at least 2:1 of the boron doped amorphous carbon compared to any of silicon dioxide, silicon nitride, monocrystalline silicon and polycrystalline silicon. Accordingly, if there are any of such materials exposed on the substrate immediately before or during the etching of the sacrificial boron doped amorphous carbon comprising spacer from the substrate, such etching can advantageously be selective to any of such exposed materials.

Referring to FIG. 8, and in but one exemplary implementation, feature 14 (not shown) has also been etched from the substrate. Such could, of course, occur before or after etching boron doped amorphous carbon comprising spacer 20 from the substrate. Alternately, depending upon the structures being formed and perhaps the type of feature being formed, the feature might remain on the substrate for a time or constitute a part of the finished/final circuitry construction.

Figure 9:
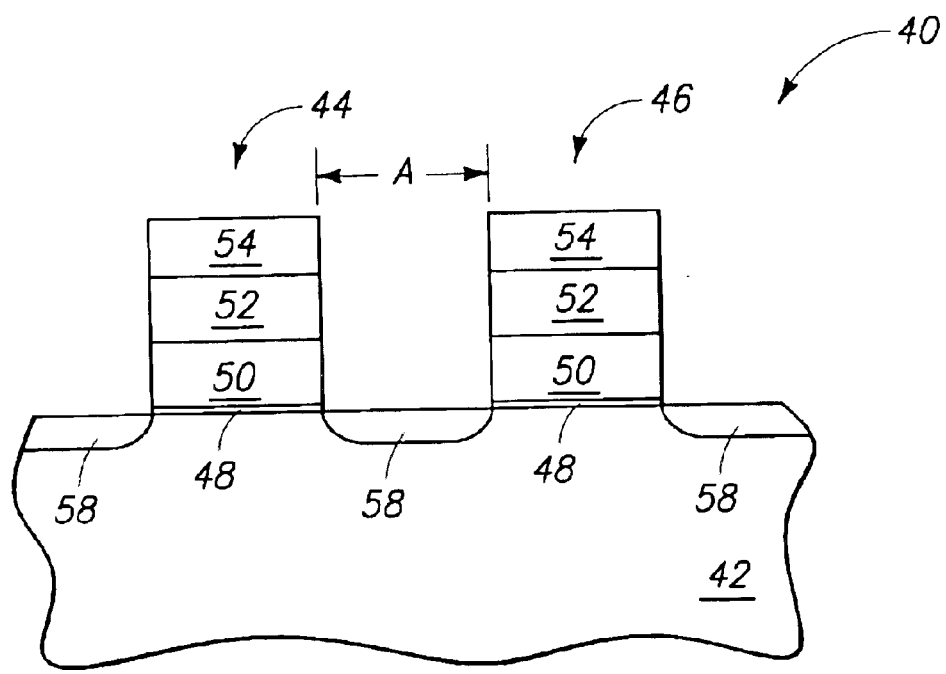
FIG. 9 is a diagrammatic sectional view of another semiconductor wafer fragment at a processing step in accordance with an aspect of the invention.

Alternate exemplary processing by way of example only is described with reference to FIGS. 9–12. FIG. 9 depicts a substrate fragment 40 comprising semiconductive substrate material 42. A pair of gate constructions 44 and 46 are formed over substrate material 42. By way of example only, such comprise a gate oxide layer 48, a conductive polysilicon layer 50, a refractory metal or refractory metal silicide layer 52, and an insulative cap 54. Gate constructions 44 and 46 can be considered as a pair of adjacent features over which the above-described masking material can be formed and subsequently processed as described above. In one exemplary considered aspect, features 44 and 46 might be formed by photolithographic processing using a mask having some minimum open dimension, for example, a dimension "A" corresponding to the separation distance between the closest walls of features 44 and 46. Dimension "A" might be slightly smaller or larger in the mask/reticle than the resultant dimension "A" between the structures shown on FIG. 9, for example depending on photolithographic processing aspects and/or aberrations. In one considered implementation, such minimum opening dimension (for example dimension "A") is ideally the smallest opening dimension utilized in any and all photolithographic processing of the semiconductor substrate before and after the masking method and methods being described herein. For example, the spacing achieved between the features 44 and 46 by photolithographic processing might be the smallest dimension technologically attainable in a production-capable process at the time of processing the substrate. Exemplary diffusion regions 58 have been formed relative to substrate 42.

Figure 10:
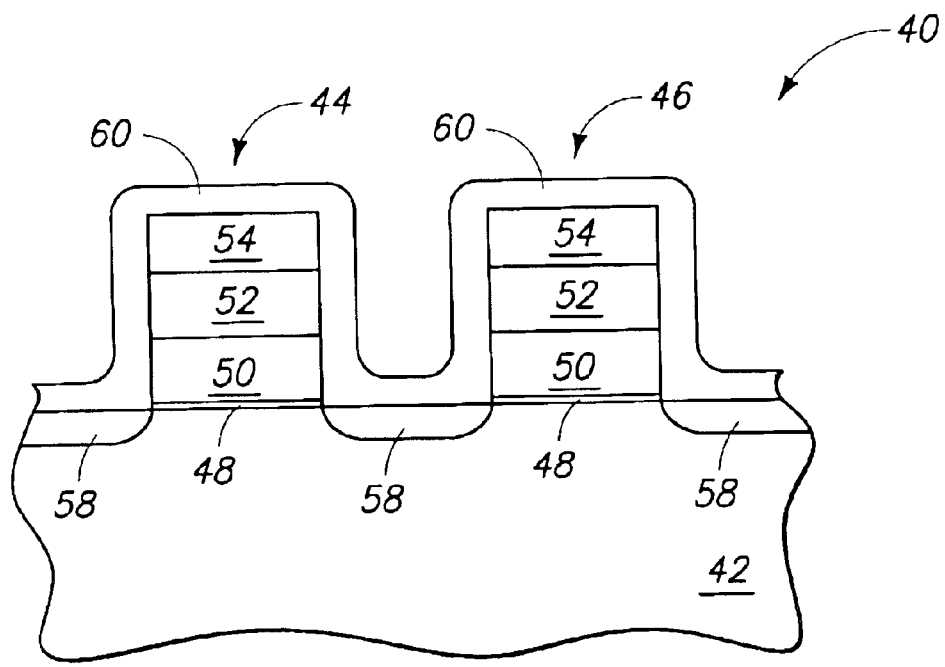
FIG. 10 is a view of the FIG. 9 wafer fragment at a processing step subsequent to that depicted by FIG. 9.

Referring to FIG. 10, masking material 60 comprising boron doped amorphous carbon is formed over the illustrated features and substrate. Such material preferably has any of the same attributes as described above with respect to masking material 18 of the first described embodiments.

Figure 11:
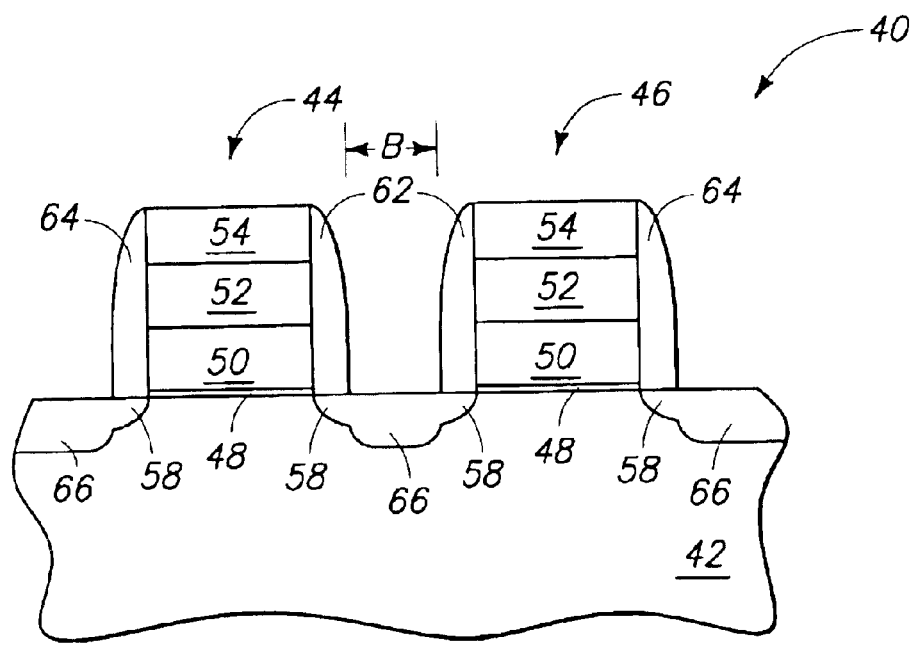
FIG. 11 is a view of the FIG. 10 wafer fragment at a processing step subsequent to that depicted by FIG. 10.

Referring to FIG. 11, masking material 60 has been substantially anisotropically etched effect to form pairs of spaced-adjacent anisotropically etched sidewall spacers 62 and sidewall spacers 64. Adjacent anisotropically etched sidewall spacers 62 are separated by a shortest distance "B" which is thereby less than the smallest opening dimension exemplified by dimension "A" in FIG. 9. Exemplary processing of the substrate proximate the spacers has been conducted in the form of implanting to form regions 66 and proximate the spacers.

Figure 12:
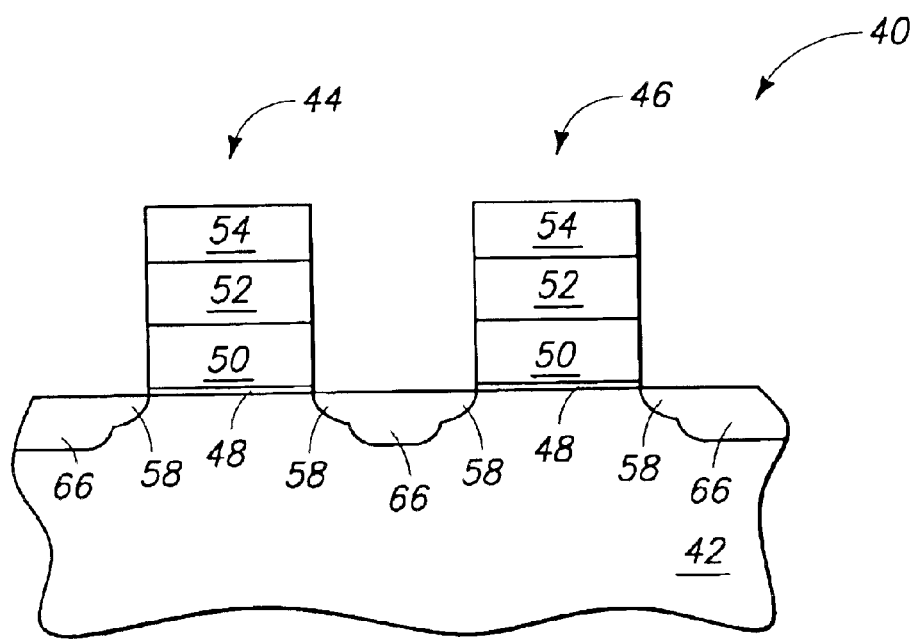
FIG. 12 is a view of the FIG. 11 wafer fragment at a processing step subsequent to that depicted by FIG. 11.

Referring to FIG. 12 the boron doped amorphous carbon comprising spacers 62 and 64 have been etched from the substrate, for example, using the processing described above.

Figure 13:
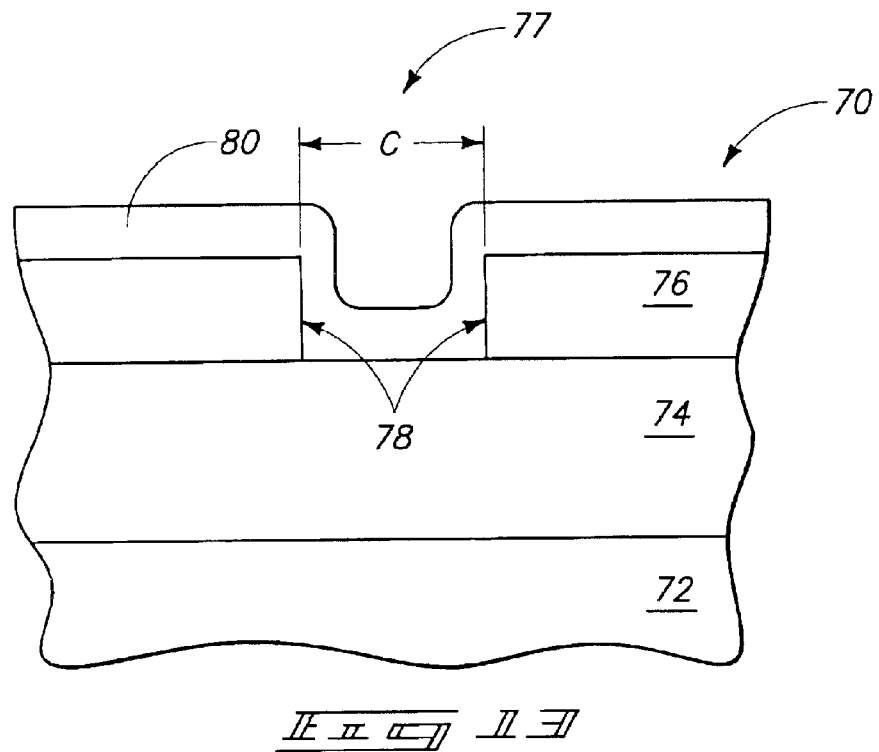
FIG. 13 is a diagrammatic sectional view of yet another semiconductor wafer fragment at a processing step in accordance with an aspect of the invention.

An alternate exemplary processing by way of example only is described with reference to FIGS. 13–15. FIG. 13 depicts a substrate fragment 70 comprising semiconductive substrate material 72. A layer 74, for example a silicon dioxide, is formed over material 72. Another layer 76, for example amorphous carbon not doped with boron, is received over material 74. An opening 77, having walls 78, is formed through layer 76. Walls 78 can be considered as part of adjacent features of layer 76 which define at least some portion of opening 77. In one exemplary considered aspect, features 78 might be formed by photolithographic processing using a mask having some minimum open dimension, for example, a dimension "C" corresponding to the separation distance between the closest walls which define opening 77. As with dimension "A" above, dimension "C" might be slightly smaller or larger in the mask/reticle than the resultant dimension "C" between the structures shown on FIG. 13, for example depending on photolithographic processing aspects and/or aberrations. In one considered implementation, such minimum opening dimension (for example dimension "C") is ideally the smallest opening dimension utilized in any and all photolithographic processing of the semiconductor substrate before and after the masking method and methods being described herein. For example, the spacing achieved between the features 78 by photolithographic processing might be the smallest dimension technologically attainable in a production-capable process at the time of processing the substrate.

A masking material 80 comprising boron doped amorphous carbon is formed over the illustrated features and substrate. Such material preferably has any of the same attributes as described above with respect to masking material 18 of the first described embodiments.

Figure 14:
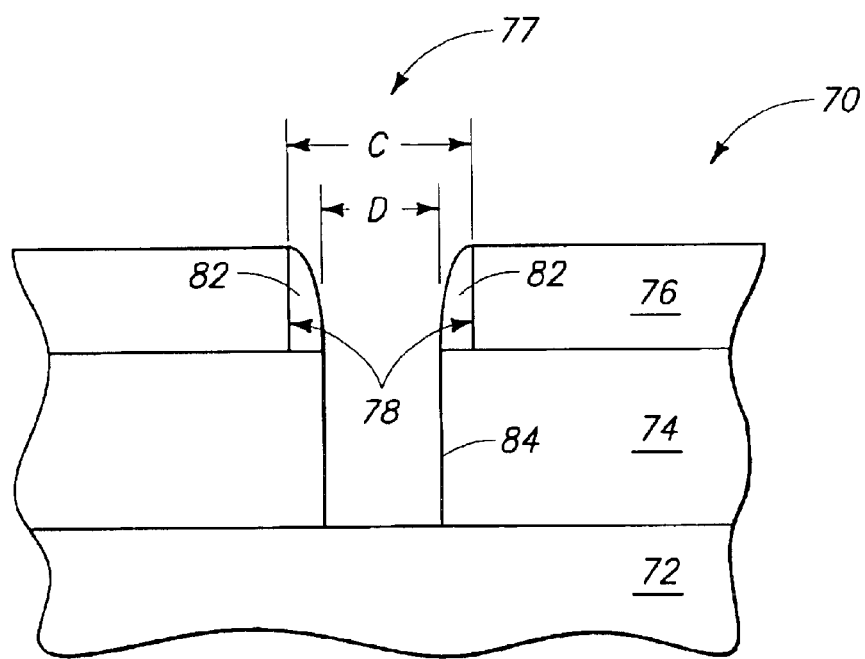
FIG. 14 is a view of the FIG. 13 wafer fragment at a processing step subsequent to that depicted by FIG. 13.

Referring to FIG. 14, masking material 80 has been substantially anisotropically etched effective to form pairs of spaced-adjacent anisotropically etched sidewall spacers 82. Adjacent anisotropically etched sidewall spacers 82 are separated by a shortest distance "D" which is thereby less than the smallest opening dimension exemplified by dimension "C" in FIG. 13. Exemplary processing of the substrate proximate the spacers has been conducted in the form of etching of layer 74 to form an opening 84 to substrate material 72 proximate spacers 82.

Figure 15:
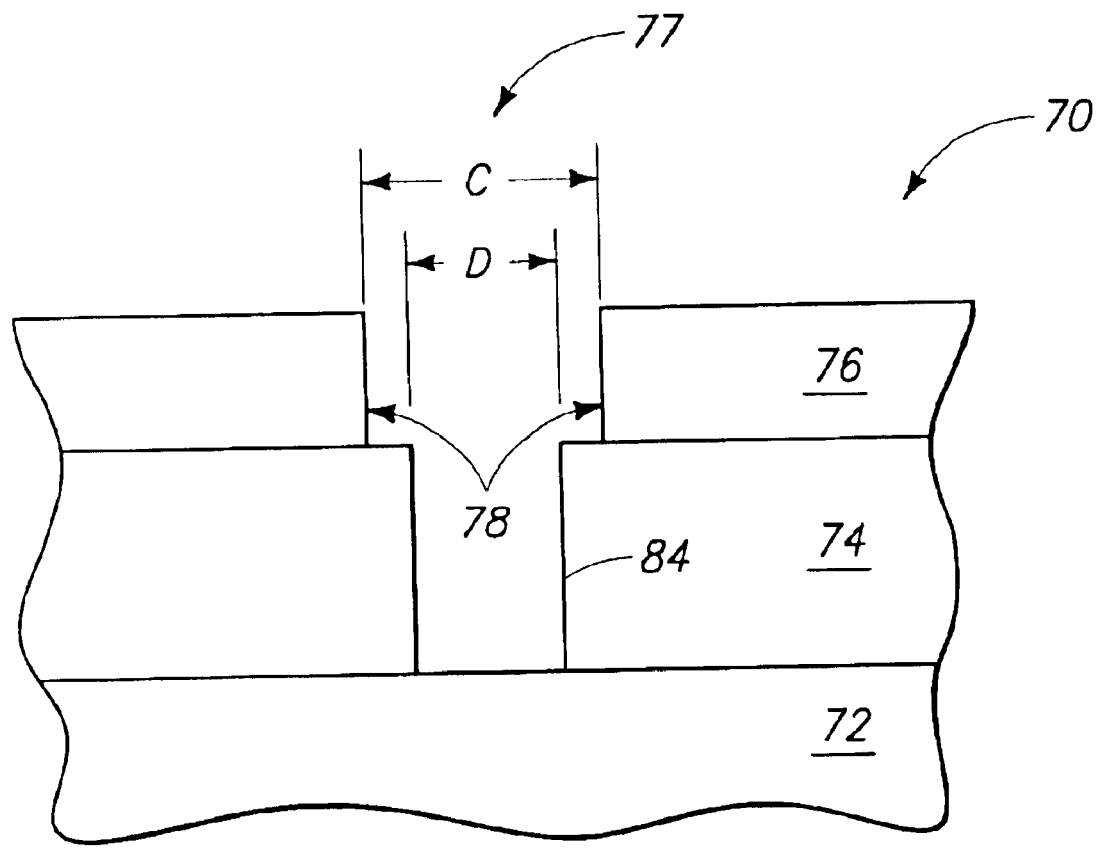
FIG. 15 is a view of the FIG. 14 wafer fragment at a processing step subsequent to that depicted by FIG. 14.

Referring to FIG. 15 the boron doped amorphous carbon comprising spacers 82 have been etched from the substrate, for example, using the processing described above.

U.S. patent application Ser. No. 10/463,185 filed on Jun. 17, 2003, entitled "Boron-Doped Amorphous Carbon Film For Use As A Hard Etch Mask During The Formation Of A Semiconductor Device", naming Zhiping Yin and Gurtej Sandhu as inventors, is hereby incorporated by reference.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A masking method comprising:

forming a masking material comprising boron doped amorphous carbon over a feature formed on a semiconductor substrate, the masking material comprising at least about 0.5 atomic percent boron;

substantially anisotropically etching the masking material effective to form an anisotropically etched sidewall spacer comprising the boron doped amorphous carbon on a sidewall of the feature;

using the boron doped amorphous carbon comprising spacer as a mask while processing the substrate proximate the spacer; and after said processing of the substrate, etching the boron doped amorphous carbon comprising spacer from the substrate.

2. A masking method comprising:

forming a masking material comprising boron doped amorphous carbon over a feature formed on a semiconductor substrate, the feature over which the masking material is formed comprising amorphous carbon which is not doped with boron, the masking material comprising at least about 0.5 atomic per cent boron;

substantially anisotropically etching the masking material effective to form an anisotropically etched sidewall spacer comprising the boron doped amorphous carbon on a sidewall of the feature;

using the boron doped amorphous carbon-comprising spacer as a mask while processing the substrate proximate the spacer; and after said processing of the substrate, etching the boron doped amorphous carbon-comprising spacer from the substrate.

3. The method of claim 2 wherein the masking material is formed on the amorphous carbon which is not doped with boron.

4. The method of claim 1 wherein, the adjacent features are formed by photolithographic processing using a mask having a minimum opening dimension; said minimum opening dimension being the smallest opening dimension utilized in any and all photolithographic processing of the semiconductor substrate before and after said masking method; and the adjacent anisotropically etched sidewall spacers are separated by a shortest distance, the shortest distance being less than the smallest opening dimension.

5. The method of claim 1 wherein the masking material consists essentially of boron doped amorphous carbon.

6. The method of claim 1 wherein the masking material consists of boron doped amorphous carbon.

7. The method of claim 1 wherein the forming comprises CVD.

8. The method of claim 7 wherein the CVD is plasma enhanced.

9. A masking method comprising:

forming a masking material comprising boron doped amorphous carbon over a feature formed on a semiconductor substrate, the forming comprising CVD wherein boron doping occurs during the CVD, the masking material comprising at least about 0.5 atomic per cent boron;

substantially anisotropically etching the masking material effective to form an anisotropically etched sidewall spacer comprising the boron doped amorphous carbon on a sidewall of the feature;

using the boron doped amorphous carbon-comprising spacer as a mask while processing the substrate proximate the spacer; and after said processing of the substrate, etching the boron doped amorphous carbon-comprising spacer from the substrate.

10. A masking method comprising:
forming a masking material comprising boron doped amorphous carbon over a feature formed on a semiconductor substrate, the forming comprising CVD wherein boron doping occurs after the CVD, the masking material comprising at least about 0.5 atomic per cent boron;
substantially anisotropically etching the masking material effective to form an anisotropically etched sidewall spacer comprising the boron doped amorphous carbon on a sidewall of the feature;
using the boron doped amorphous carbon-comprising spacer as a mask while processing the substrate proximate the spacer; and
after said processing of the substrate, etching the boron doped amorphous carbon-comprising spacer from the substrate.

11. A masking method comprising:
forming a masking material comprising boron doped amorphous carbon over a feature formed on a semiconductor substrate; the forming comprising CVD using at least one of $C_2H_6$, $C_2H_4$, $C_2H_2$, $C_3H_6$, and $C_3H_8$; and using at least one of $B_2H_6$, $B_4H_{10}$ and $BH_3CO$; the masking material comprising at least about 0.5 atomic per cent boron;
substantially anisotropically etching the masking material effective to form an anisotropically etched sidewall spacer comprising the boron doped amorphous carbon on a sidewall of the feature;
using the boron doped amorphous carbon-comprising spacer as a mask while processing the substrate proximate the spacer; and
after said processing of the substrate, etching the boron doped amorphous carbon-comprising spacer from the substrate.

12. The method of claim 11 wherein the CVD is plasma enhanced.

13. The method of claim 11 wherein the CVD is not plasma enhanced.

14. The method of claim 1 wherein the feature sidewall is substantially perpendicular to the substrate.

15. The method of claim 1 wherein the masking material comprises from 1.0 atomic percent to 5.0 atomic percent boron.

16. The method of claim 1 wherein the masking material comprises from greater than 5.0 atomic percent to 10.0 atomic percent boron.

17. The method of claim 1 wherein the masking material comprises from greater than 10.0 atomic percent to 15.0 atomic percent boron.

18. The method of claim 1 wherein the masking material comprises from greater than 15.0 atomic percent to 20.0 atomic percent boron.

19. The method of claim 1 wherein the masking material comprises from greater than 20.0 atomic percent to 75.0 atomic percent boron.

20. A masking method comprising:
forming a masking material comprising boron doped amorphous carbon over a feature formed on a semiconductor substrate, the masking material comprising at least about 0.5 atomic per cent boron;
substantially anisotropically etching the masking material effective to form an anisotropically etched sidewall spacer comprising the boron doped amorphous carbon on a sidewall of the feature;
using the boron doped amorphous carbon-comprising spacer as a mask while processing the substrate proximate the spacer, the processing of the substrate using the boron doped amorphous carbon-comprising spacer as a mask comprising etching the substrate; and
after said processing of the substrate, etching the boron doped amorphous carbon-comprising spacer from the substrate.

21. The method of claim 1 wherein the processing of the substrate using the boron doped amorphous carbon comprising spacer as a mask comprises ion implanting into the substrate.

22. A masking method comprising:
formed a masking material comprising boron doped amorphous carbon over a feature formed on a semiconductor substrate, the masking material comprising at least about 0.5 atomic per cent boron;
substantially anisotropically etching the masking material effective to form an anisotropically etched sidewall spacer comprising the boron doped amorphous carbon on a sidewall of the feature;
using the boron doped amorphous carbon-comprising spacer as a mask while processing the substrate proximate the spacer, the processing of the substrate using the boron doped amorphous carbon-comprising spacer as a mask comprising a selective deposition upon the substrate which does not extend to over an elevationally topmost portion of the spacer; and
after said processing of the substrate, etching the boron doped amorphous carbon-comprising spacer from the substrate.

23. The method of claim 1 wherein the etching is with an $O_2$ comprising plasma.

24. A masking method comprising:
forming a masking material comprising boron doped amorphous carbon over a feature formed on a semiconductor substrate, the masking material comprising at least about 0.5 atomic per cent boron, the feature comprising at least one of conductive or semiconductive material;
substantially anisotropically etching the masking material effective to form an anisotropically etch sidewall spacer comprising the boron doped amorphous carbon on a sidewall of the feature;
using the boron doped amorphous carbon-comprising spacer as a mask while processing the substrate proximate the spacer;
after said processing of the substrate, etching the boron doped amorphous carbon-comprising spacer from the substrate; and
after said processing of the substrate, etching all of the at least one of conductive or semiconductive material of the feature from the substrate.

25. The method of claim 24 wherein said feature is etched from the substrate after the boron doped amorphous carbon comprising spacer is etched from the substrate.

26. A masking method comprising:
chemical vapor depositing a masking material comprising boron doped amorphous carbon over a pair of spaced adjacent features formed on a semiconductor substrate, the masking material comprising from about 1.0 atomic per cent to about 20 atomic per cent boron;
substantially anisotropically etching the masking material effective to form a pair of spaced adjacent anisotropically etched sidewall spacers comprising the boron doped amorphous carbon on sidewalls of the features;

using the boron doped amorphous carbon-comprising spacer as a mask while processing the substrate between the spacers; and after said processing of the substrate, etching the boron doped amorphous carbon-comprising spacers from the substrate using an $O_2$-comprising plasma selective to at least one of exposed silicon dioxide, silicon nitride and silicon.

27. A masking method comprising:

chemical vapor depositing a masking material comprising boron doped amorphous carbon over a feature formed on a semiconductor substrate, the feature over which the masking material is formed comprising amorphous carbon which is not doped with boron, the masking material comprising from about 1.0 atomic per cent to about 20 atomic per cent boron;

substantially anisotropically etching the masking material effective to form an anisotropically etched sidewall spacer comprising the boron doped amorphous carbon on a sidewall of the feature;

using the boron doped amorphous carbon-comprising spacer as a mask while processing the substrate proximate the spacer; and after said processing of the substrate, etching the boron doped amorphous carbon-comprising spacer from the substrate using an $O_2$-comprising plasma substantially selective to at least one of exposed silicon dioxide, silicon nitride and silicon.

28. The method of claim 27 wherein the masking material is formed on the amorphous carbon which is not doped with boron.

29. The method of claim 26 wherein, the adjacent features are formed by photolithographic processing using a mask having a minimum opening dimension; said minimum opening dimension being the smallest opening dimension utilized in any and all photolithographic processing of the semiconductor substrate before and after said masking method; and the adjacent anisotropically etched sidewall spacers are separated by a shortest distance, the shortest distance being less than the smallest opening dimension.

30. The method of claim 26 wherein the masking material consists essentially of boron doped amorphous carbon.

31. The method of claim 26 wherein the CVD is plasma enhanced.

32. A masking method comprising:

chemical vapor depositing a masking material comprising boron doped amorphous carbon over a feature formed on a semiconductor substrate, the chemical vapor depositing not being plasma enhanced, the masking material comprising from about 1.0 atomic per cent to about 20 atomic per cent boron;

substantially anisotropically etching the masking material effective to form an anisotropically etched sidewall spacer comprising the boron doped amorphous carbon on a sidewall of the feature;

using the boron doped amorphous carbon-comprising spacer as a mask while processing the substrate proximate the spacer; and after said processing of the substrate, etching the boron doped amorphous carbon-comprising spacer from the substrate using an $O_2$-comprising plasma substantially selective to at least one of exposed silicon dioxide, silicon nitride and silicon.

33. A masking method comprising:

chemical vapor depositing a masking material comprising boron doped amorphous carbon over a feature formed on a semiconductor substrate, wherein boron doping occurs during the chemical vapor depositing, the masking material comprising from about 1.0 atomic per cent to about 20 atomic per cent boron;

substantially anisotropically etching the masking material effective to form an anisotropically etched sidewall spacer comprising the boron doped amorphous carbon on a sidewall of the feature;

using the boron doped amorphous carbon-comprising spacer as a mask while processing the substrate proximate the spacer; and after said processing of the substrate, etching the boron doped amorphous carbon-comprising spacer from the substrate using an $O_2$-comprising plasma substantially selective to at least one of exposed silicon dioxide, silicon nitride and silicon.

34. A masking method comprising:

chemical vapor depositing a masking material comprising boron doped amorphous carbon over a feature formed on a semiconductor substrate, wherein boron doping occurs after the chemical vapor depositing, the masking material comprising from about 1.0 atomic per cent to about 20 atomic per cent boron;

substantially anisotropically etching the masking material effective to form an anisotropically etched sidewall spacer comprising the boron doped amorphous carbon on a sidewall of the feature;

using the boron doped amorphous carbon-comprising spacer as a mask while processing the substrate proximate the spacer; and after said processing of the substrate, etching the boron doped amorphous carbon-comprising spacer from the substrate using an $O_2$-comprising plasma substantially selective to at least one of exposed silicon dioxide, silicon nitride and silicon.

35. A masking method comprising:

chemical vapor depositing a masking material comprising boron doped amorphous carbon over a feature formed on a semiconductor substrate, the chemical vapor depositing using at least one of $C_2H_6$, $C_2H_4$, $C_2H_2$, $C_3H_6$, and $C_3H_8$; and using at least one of $B_2H_6$, $B_2H_6$, $B_4H_{10}$ and $BH_3CO$; the masking material comprising from about 1.0 atomic per cent to about 20 atomic per cent boron;

substantially anisotropically etching the masking material effective to form an anisotropically etched sidewall spacer comprising the boron doped amorphous carbon on a sidewall of the feature;

using the boron doped amorphous carbon-comprising spacer as a mask while processing the substrate proximate the spacer; and after said processing of the substrate, etching the boron doped amorphous carbon-comprising spacer from the substrate using an $O_2$-comprising plasma substantially selective to at least one of exposed silicon dioxide, silicon nitride and silicon.

36. The method of claim 35 wherein the sidewalls are substantially perpendicular to the substrate.

37. A masking method comprising:

chemical vapor depositing a masking material comprising boron doped amorphous carbon over a feature formed on a semiconductor substrate, the masking material comprising from about 1.0 atomic per cent to about 20 atomic per cent boron;

substantially anisotropically etching the masking material effective to form an anisotropically etched sidewall spacer comprising the boron doped amorphous carbon on a sidewall of the feature;

using the boron doped amorphous carbon-comprising spacer as a mask while processing the substrate proximate the spacer, the processing of the substrate using the boron doped amorphous carbon-comprising spacer as a mask comprising etching the substrate; and after said processing of the substrate, etching the boron doped amorphous carbon-comprising spacer from the substrate using an $O_2$-comprising plasma substantially selective to at least one of exposed silicon dioxide, silicon nitride and silicon.

38. The method of claim 28 wherein the processing of the substrate using the boron doped amorphous carbon comprising spacers as a mask comprises ion implanting into the substrate.

39. A masking method comprising:

chemical vapor depositing a masking material comprising boron doped amorphous carbon over a feature formed on a semiconductor substrate, the masking material comprising from about 1.0 atomic percent to about 20 atomic percent boron;

substantially anisotropically etching the masking material effective to form an anisotropically etched sidewall spacer comprising the boron doped amorphous carbon on a sidewall of the feature;

using the boron doped amorphous carbon comprising spacer as a mask while processing the substrate proximate the spacer; and after said processing of the substrate, etching the boron doped amorphous carbon comprising spacer from the substrate using an $O_2$ comprising plasma substantially selective to at least one of exposed silicon dioxide, silicon nitride and silicon.

40. A masking method comprising:

chemical vapor depositing a masking material comprising boron doped amorphous carbon over a feature formed on a semiconductor substrate, the masking material comprising from about 1.0 atomic per cent to about 20 atomic per cent boron;

substantially anisotropically etching the masking material effective to form an anisotropically etched sidewall spacer comprising the boron doped amorphous carbon on a sidewall of the feature;

using the boron doped amorphous carbon-comprising spacer as a mask while processing the substrate proximate the spacer;

after said processing of the substrate, etching the boron doped amorphous carbon-comprising spacer from the substrate using an $O_2$-comprising plasma substantially selective to at least one of exposed silicon dioxide, silicon nitride and silicon; and after said processing of the substrate, etching the feature from the substrate.

41. The method of claim 40 wherein said feature is etched from the substrate after the boron doped amorphous carbon-comprising spacer is etched from the substrate.

42. The method of claim 24 wherein said feature is etched from the substrate before the boron doped amorphous carbon-comprising spacer is etched from the substrate.

43. The method of claim 40 wherein said feature is etched from the substrate before the boron doped amorphous carbon-comprising spacer is etched from the substrate.

44. A masking method comprising:

forming a masking material comprising boron doped amorphous carbon over a feature formed on a semiconductor substrate, the masking material comprising at least about 0.5 atomic per cent boron, substantially anisotropically etching the masking material effective to form an anisotropically etched sidewall spacer comprising the boron doped amorphous carbon on a sidewall of the feature;

using the boron doped amorphous carbon-comprising spacer as a mask while processing the substrate proximate the spacer;

after said processing of the substrate, etching the boron doped amorphous carbon-comprising spacer from the substrate; and after etching the boron doped amorphous carbon-comprising spacer from the substrate, etching the feature from the substrate.

* * * * *

UNITED STATES PATENT AND TRADEMARK OFFICE
CERTIFICATE OF CORRECTION

PATENT NO. : 7,105,431 B2
APPLICATION NO. : 10/652174
DATED : September 12, 2006
INVENTOR(S) : Yin et al.

It is certified that error appears in the above-identified patent and that said Letters Patent is hereby corrected as shown below:

Title Page 2, U.S. PATENT DOCUMENTS, please delete "2002/0185667" after "2002/0132451 A1  12/2002 Akino et al." and insert --2002-0185687--.

Col. 6, line 55, please delete "effect" after "etched" and insert --effective--.

Col. 7, line 65, claim 1, please delete "feature" after "over a" and insert --pair of spaced adjacent features--.

Col. 8, line 5, claim 1, please delete "carbon comprising" after "amorphous" and insert --carbon-comprising--.

Col. 8, lines 6-7, claim 1, please delete "proximate the spacer;" after "substrate" and insert --between the spacers;--.

Col. 9, line 41, claim 14, please delete "feature sidewall is" after "wherein the" and insert --sidewalls are--.

Col. 12, line 45, claim 35, please delete "$B_2H_6$," after "$B_2H_6$,".

Col. 12, line 62, claim 36, please delete "claim 35" after "method of" and insert --claim 26--.

Col. 13, line 17, claim 38, please delete "claim 28" after "method of" and insert --claim 26--.

UNITED STATES PATENT AND TRADEMARK OFFICE
CERTIFICATE OF CORRECTION

PATENT NO.        : 7,105,431 B2
APPLICATION NO.   : 10/652174
DATED             : September 12, 2006
INVENTOR(S)       : Yin et al.

It is certified that error appears in the above-identified patent and that said Letters Patent is hereby corrected as shown below:

Col. 13, line 34, claim 39, please insert --, the processing of the substrate using the boron doped amorphous carbon-comprising spacer as a mask comprising a selective deposition upon the substrate which does not extend to over an elevationally topmost portion of the spacer;-- after "spacer".

Signed and Sealed this

Twenty-sixth Day of June, 2007

JON W. DUDAS
*Director of the United States Patent and Trademark Office*